United States Patent
Burcar et al.

(10) Patent No.: US 11,740,295 B2
(45) Date of Patent: Aug. 29, 2023

(54) METHOD AND SYSTEM FOR TESTING AND CHARGING A VEHICLE BATTERY

(71) Applicants: James M Burcar, Rochester, MI (US); Rohith Seelam, Sterling Heights, MI (US); Ralph S Barthel, Clinton Township, MI (US); David M Failla, Lake Orion, MI (US)

(72) Inventors: James M Burcar, Rochester, MI (US); Rohith Seelam, Sterling Heights, MI (US); Ralph S Barthel, Clinton Township, MI (US); David M Failla, Lake Orion, MI (US)

(73) Assignee: FCA US LLC, Auburn Hills, MI (US)

( * ) Notice: Subject to any disclaimer, the term of this patent is extended or adjusted under 35 U.S.C. 154(b) by 146 days.

(21) Appl. No.: 17/231,584

(22) Filed: Apr. 15, 2021

(65) Prior Publication Data
US 2022/0334188 A1    Oct. 20, 2022

(51) Int. Cl.
*G01R 31/385* (2019.01)
*B60L 58/16* (2019.01)
*G01R 31/389* (2019.01)
*G01R 31/367* (2019.01)
*G01R 31/392* (2019.01)

(52) U.S. Cl.
CPC .......... *G01R 31/386* (2019.01); *B60L 58/16* (2019.02); *G01R 31/367* (2019.01); *G01R 31/389* (2019.01); *G01R 31/392* (2019.01)

(58) Field of Classification Search
CPC .. G01R 31/386; G01R 31/392; G01R 31/389; G01R 31/367; B60L 58/16; B60L 2240/547; B60L 2270/40
USPC ................................................. 324/425–441
See application file for complete search history.

(56) References Cited

U.S. PATENT DOCUMENTS

| 5,936,383 A * | 8/1999 | Ng | G01R 31/389 |
| | | | 320/132 |
| 2016/0344068 A1 * | 11/2016 | Kim | H01M 12/08 |

* cited by examiner

*Primary Examiner* — Vincent Q Nguyen
*Assistant Examiner* — Trung Q Nguyen
(74) *Attorney, Agent, or Firm* — Jeremy J. Klobucar

(57) ABSTRACT

A system and method for performing a vehicle battery test includes a battery tester having a controller programed to obtain a first battery parameter and a second battery parameter of a primary battery from a vehicle controller, compare the first battery parameter to a first threshold, compare the second battery parameter to a second threshold and perform a reserve charge test on the battery using the battery tester or generating a display indicative of high corrosion or a bad cell in response to the compare the first battery parameter and compare the second battery parameter steps being performed by the controller.

15 Claims, 4 Drawing Sheets

METHOD AND SYSTEM FOR TESTING AND CHARGING A VEHICLE BATTERY

TECHNICAL FIELD

The present disclosure relates generally to a battery system for a vehicle and, more specifically, to a method and system testing and charging a battery.

BACKGROUND

The statements in this section merely provide background information related to the present disclosure and does not constitute prior art.

Vehicle batteries often need testing. Testing takes place before the vehicle leaves the assembly plant, Dealerships also test batteries. Vehicles have one primary battery or a primary battery and possibly an auxiliary or secondary battery. In a vehicle with more than one battery, separate tests are currently run on each battery. This doubles the amount of time to perform a test. A typical battery tester requires a significant amount of technician involvement for the particular vehicle and selection of the appropriate process. Because significant technician involvement is required, errors due to improper entry of data take place.

Another problem with testing batteries with a battery tester is that the software running the battery test must be updated. A typical tester is updated by downloading an update onto a memory device such as a thumb drive. The thumb drive is then connected to the battery tester to update the testing software. Also, when tests are run and failures occur, repeated attempts are performed without reaching a prompt conclusion. Providing the customer with a short wait time at a dealer, when problems occur, is desirable.

SUMMARY

The present disclosure provides a system and method for testing a battery accurately and efficiently.

In one aspect of the disclosure, a system and method for performing a vehicle battery test includes a battery tester having a controller programed to obtain battery parameters from the primary battery. A first battery parameter of a primary battery and a second battery parameter of the primary battery are obtained from a vehicle controller, compare the first battery parameter to a first threshold, compare the second battery parameter to a second threshold and perform a reserve charge test on the battery using the battery tester or generating a display indicative of high corrosion or a bad cell in response to the compare the first battery parameter and compare the second battery parameter steps being performed by the controller.

In a further aspect of the disclosure, a method includes coupling a battery tester to terminals of a primary battery of a vehicle, coupling the battery tester to a vehicle controller in the vehicle, communicating a first battery parameter of the primary battery and a second battery parameter of the primary battery from the vehicle controller to the battery tester, comparing the first battery parameter to a first threshold, comparing the second battery parameter to a second threshold and, in response to comparing the first battery parameter and the second battery parameter, performing a reserve charge test to determine a reserve charge on the battery using the battery tester or generating a display indicative of high corrosion or a bad cell.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
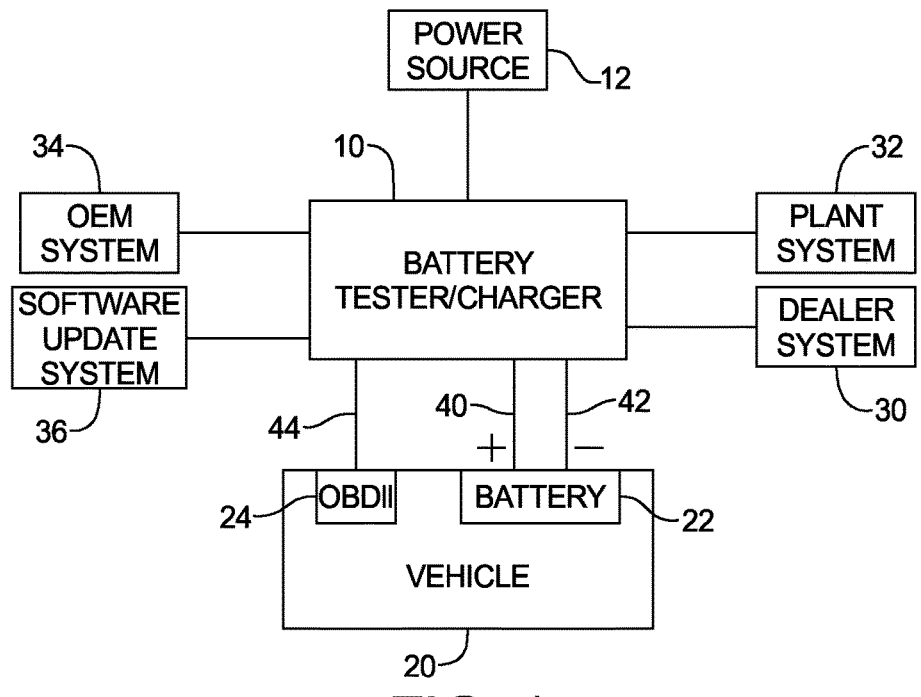
FIG. 1 is a block diagrammatic view of a battery tester/charger relative to a vehicle and other components.

The following description is merely exemplary in nature and is not intended to limit the present disclosure, application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical OR. It should be understood that steps within a method are executable in different order without altering the principles of the present disclosure. The controllers, programmed to perform certain steps, are formable using a general computing device having a memory or other data storage for incoming and outgoing data. The memory illustratively is, but is not limited, any of a hard drive, FLASH, RAM, PROM, EEPROM, ROM phase-change memory, other discrete memory components, or any combination thereof. Each general purpose computing device is implementable electronically in analog circuitry, digital circuitry or combinations thereof. Further, the computing device in an example includes a microprocessor or microcontroller that performs instructions to carry out the steps performed by the various system components.

Referring now to FIG. 1, a battery tester/charger 10 is illustrated coupled to a power source 12. The battery tester/charger 10 is also coupled to a vehicle 20. The vehicle 20 includes a battery 22 and an onboard diagnostic port 24. The port 24 is implemented as a physical connector, in this example. A wireless port is an alternative. The battery 22 includes a main battery and possibly a reserve battery as will be described in more detail below. The battery tester/charger 10 is used to test the state of the battery. The battery tester/charger also is used to charge the battery.

The power source 12 is 110 V wall outlet. However, different types of wall outlets such as 220 V are possible. Of course, other sources of power such as European standards are possible.

The battery tester/charger 10 is in communication with a dealer system 30, a plant system 32 and an OEM system 34. The dealer system 30, the plant system 32 and the OEM system 34 is wired or wirelessly connected to the battery tester/charger 10. For example, the battery tester/charger 10 includes a Wi-Fi interface for communicating with the systems 30-34 through an internet connection. Likewise, the battery tester/charger 10 is in communication with a software update system 36. The software update system 36 is coupled with a wired or wireless system. That is, the software update system 36 provides software updates to the battery tester/charger 10 using the internet.

The battery tester/charger 10 has leads 40, 42 that are connected to the positive and negative terminals of the battery 22, respectively. Of course, the battery tester/charger 10 is capable of testing and charging more than one battery. In that case, more than one pair of leads is provided. Further, only one common lead 42, is provided with multiple positive leads. The battery tester/charger 10 includes a wire 44 that couples the battery tester/charger 10 to the diagnostic port 24.

Figure 2A:
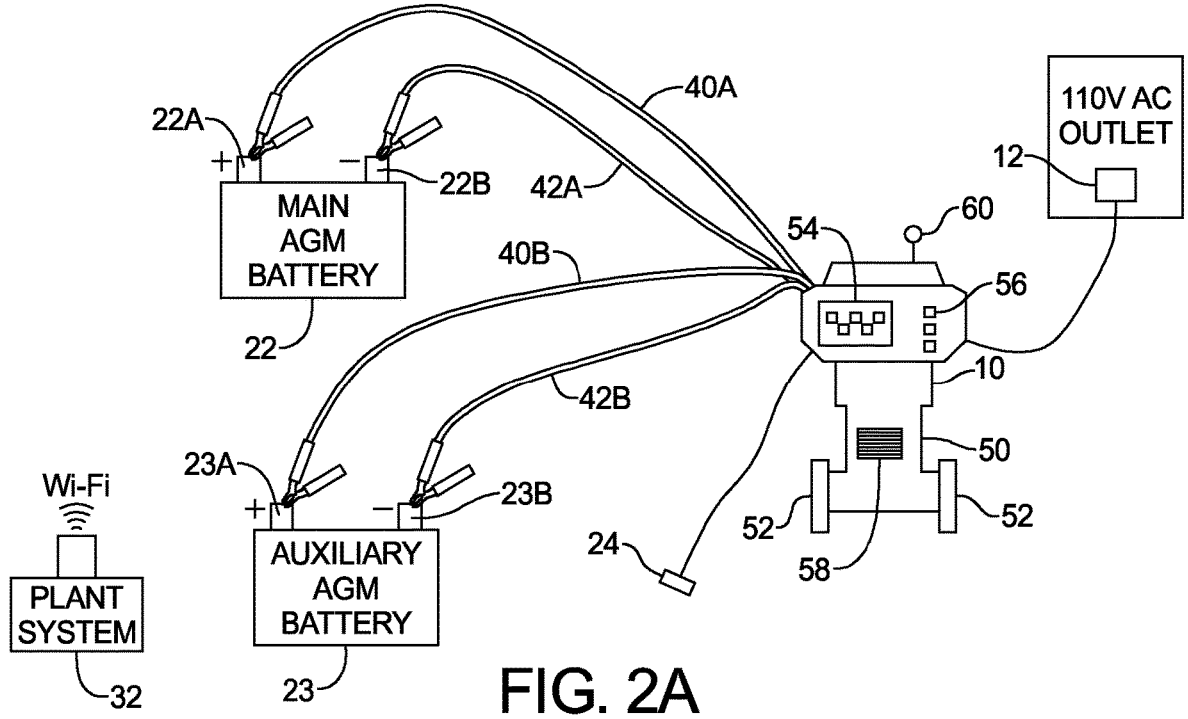
FIG. 2A is a diagrammatic view of a battery tester/charger for a system having an auxiliary battery.
Figure 2B:
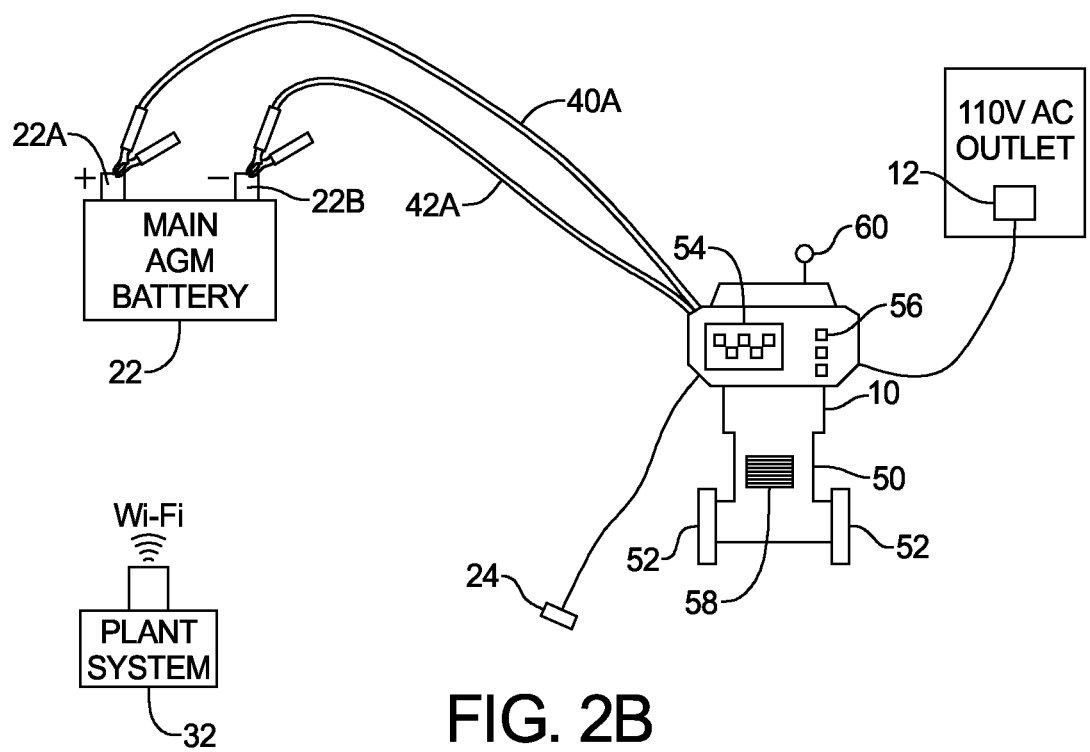
FIG. 2B is a diagrammatic view of a system for a single battery.

Referring now to FIG. 2A, the battery tester/charger 10 is illustrated in use. The charger 10 has a frame 50 that is coupled to a pair of wheels 52 to support the various components. It is possible for the battery tester/charger 10 to use various numbers of wheels 52.

The battery tester/charger 10 also includes a display 54 used for displaying various test results. Should the display be touchscreen, various types of data or selections are made directly with the touchscreen which acts as a user interface. While illustratively set forth as a screen, the display 54 having light emitting diodes, lights or the like is contemplated. As will be described below, the display provides an indication of tested parameters such as state of health, internal resistance, reserve charge, cold cranking amps, load and open circuit voltage.

The battery tester/charger 10 includes push buttons 56 used for making various selections. The push buttons 56, although three are illustrated, have various numbers, selections, words or the like thereon for making a selection or entering data.

The battery tester/charger 10, in this example, also includes a printer 58 for printing the results of a single or dual battery test that are provided to the end user.

As was illustrated above, the battery tester/charger 10 is coupled to a diagnostic port 24 such as an on-board diagnostic port (OBD II).

The battery tester/charger 10 is illustrated coupled to the primary battery 22 and a second or auxiliary battery 23. In this example, two sets of leads 40A, 40B, 42A and 42B are illustrated. Leads 40A and 40B are coupled to the positive terminals 22A, 23A respectively. The leads 42A and 42B are coupled to the negative terminals 22B, 23B of the batteries 22, 23 respectively.

The battery tester/charger 10 illustratively includes an antenna 60 for communicating with various devices such as a plant system 62. The antenna 60 communicates with a network such as through a Wi-Fi system such as the plant system 32, the dealer system 30 illustrated in FIG. 1 or the OEM system 34 illustrated in FIG. 4. Likewise, the antenna 60 is also used to communicate with a software update system 36.

The display 54 illustratively shows two diagnostic encrypted codes when two batteries in a dual battery system or a single diagnostic code when a single battery is used. A diagnostic code is also generated when a battery replacement is not required.

By providing a communication to the plant system 32, the operator is provided data on the charge delta and charge duration. A supplier, resident and design engineer are provided with data to analyze vehicles and repair the electrical systems of the vehicle appropriately. The batteries 22, 23 for example, are lead acid, absorbent glass mat batteries or another type of battery.

Figure 3:
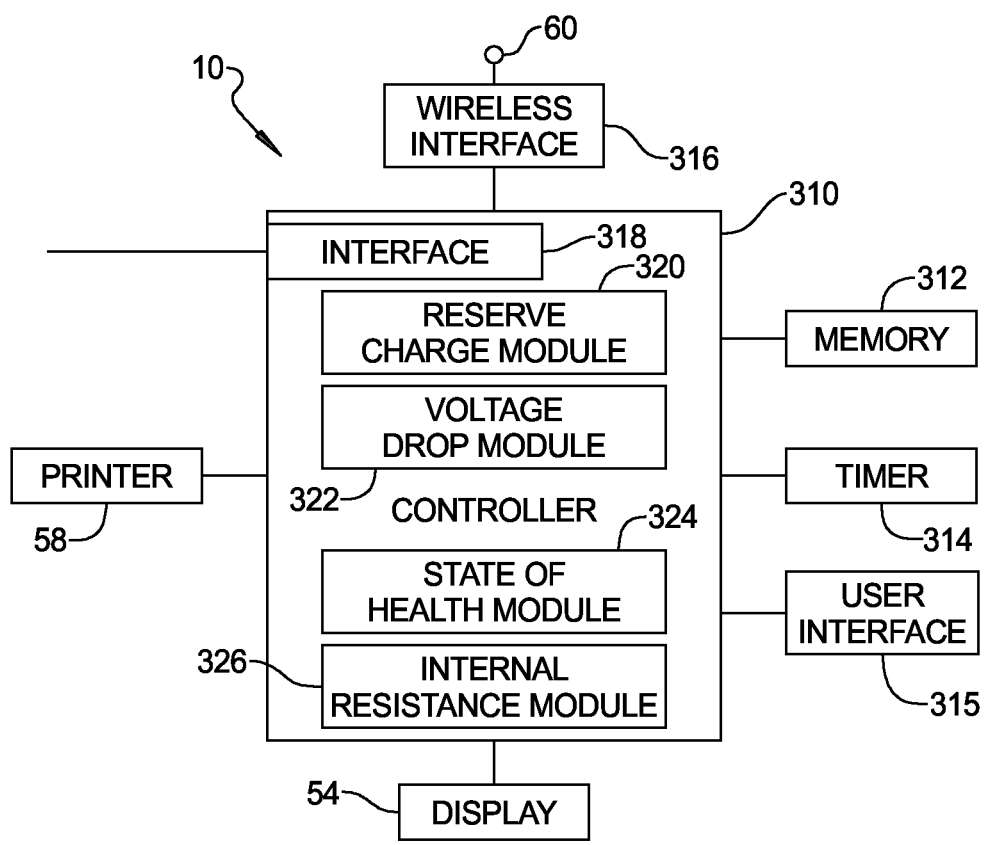
FIG. 3 is a block diagrammatic view of a battery tester/charger system.

Referring now to FIG. 3, the battery tester/charger 10 is illustrated in further detail. In this example, a controller 310 such as a microprocessor-based controller is programmed to provide the testing function. The controller 310 is in communication with a memory 312 that stores various types of data including the software for performing tests and charging, test data, intermediate test data and the like. A timer 314 provides the time of day for the test. The timer 314 times the duration of various tests. As is described below, the timer 314 provides time data so that tests are not performed unnecessarily long.

A user interface 315 is provided. The user interface 315 comprises knobs, buttons, switches, or dials. The user interface 315 is possibly implemented in a touch screen display.

The controller 310 is also illustrated in communication with the display 54 and the printer 58 described above.

The controller 310 is also in communication with the antenna 60 which communicates data or receives data through the wireless interface 316. The antenna 60 is capable of transmitting and receiving data from the systems described above with respect to FIG. 1.

The controller 310 has various modules therein. The modules include an interface 318. The interface 318, in this example, is a wired interface. The interface 318 is used for communicating with a wired connection such as the diagnostic connector 24 illustrated above.

The controller 310 is used for performing various tasks. Therefore, various modules are included within the controller 310. A reserve charge module 320, a voltage drop module 322, a state of health module 324 and an internal resistance module 326 are provided within the controller 310. The reserve charge module 320 performs a reserve charge test that provides data as to the amount of reserve charge available for the battery or batteries to which the battery tester/charger 10 is coupled. The voltage drop module 322 performs a voltage drop test that provides an indicator as to the amount of voltage drop for a battery or batteries. A state of health module 324 determines a state of health and compares the state of health to a threshold. The state of health is obtained from the vehicle battery sensor. An internal resistance module 326 provides an indication of the internal resistance of the battery and provides a comparison with an internal resistance threshold as will be described in further detail below. The internal resistance of the battery is obtained from the battery sensor of the vehicle.

Figure 4:
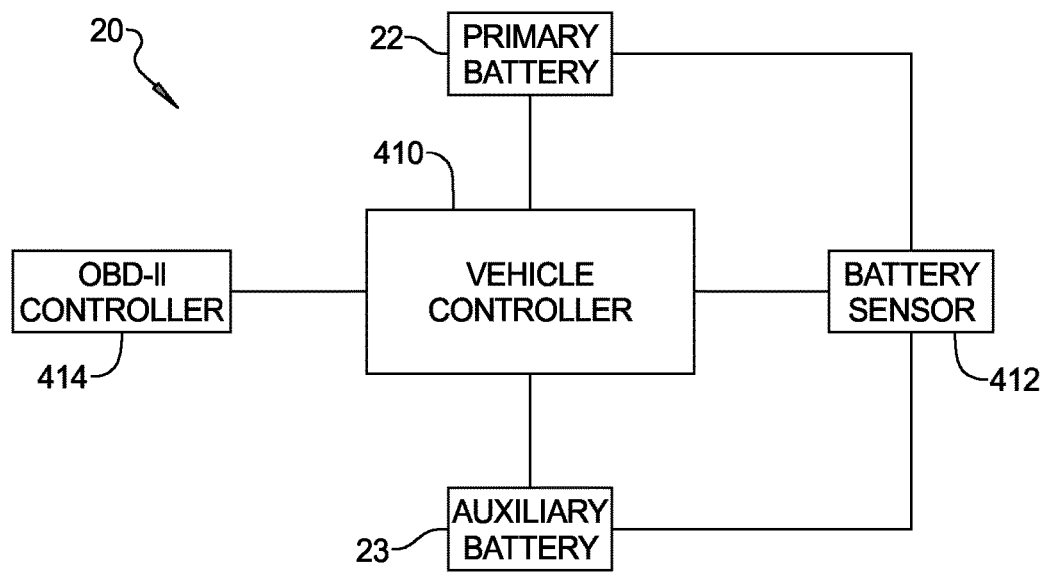
FIG. 4 is a block diagrammatic view of a vehicle system.

Referring now to FIG. 4, the vehicle 20 is illustrated in further detail. The vehicle 20 includes a vehicle controller 410 that is in communication with a battery sensor 412. The battery sensor 412, is capable of performing various functions and providing data regarding the batteries within the vehicle. The battery sensor 412 is in communication with the primary battery 22 and the secondary battery 23. The battery sensor 412 is referred to as an intelligent battery sensor (IBS) that provides a first battery parameter such as a battery state of health (SOH) and a second battery parameter such as a battery internal resistance (IR) of the primary battery 22 and the secondary battery 23. The battery state of health and the battery internal resistance are used to determine the need for replacement on high corrosion or internal manufacturing "bad" cell type failures.

The determination of the battery sensor 412 are communicated to the vehicle controller 410, which in turn, are communicated to the diagnostic controller 414. The diagnostic controller 414 is used to communicate data to the battery tester/charger 10.

Figure 5:
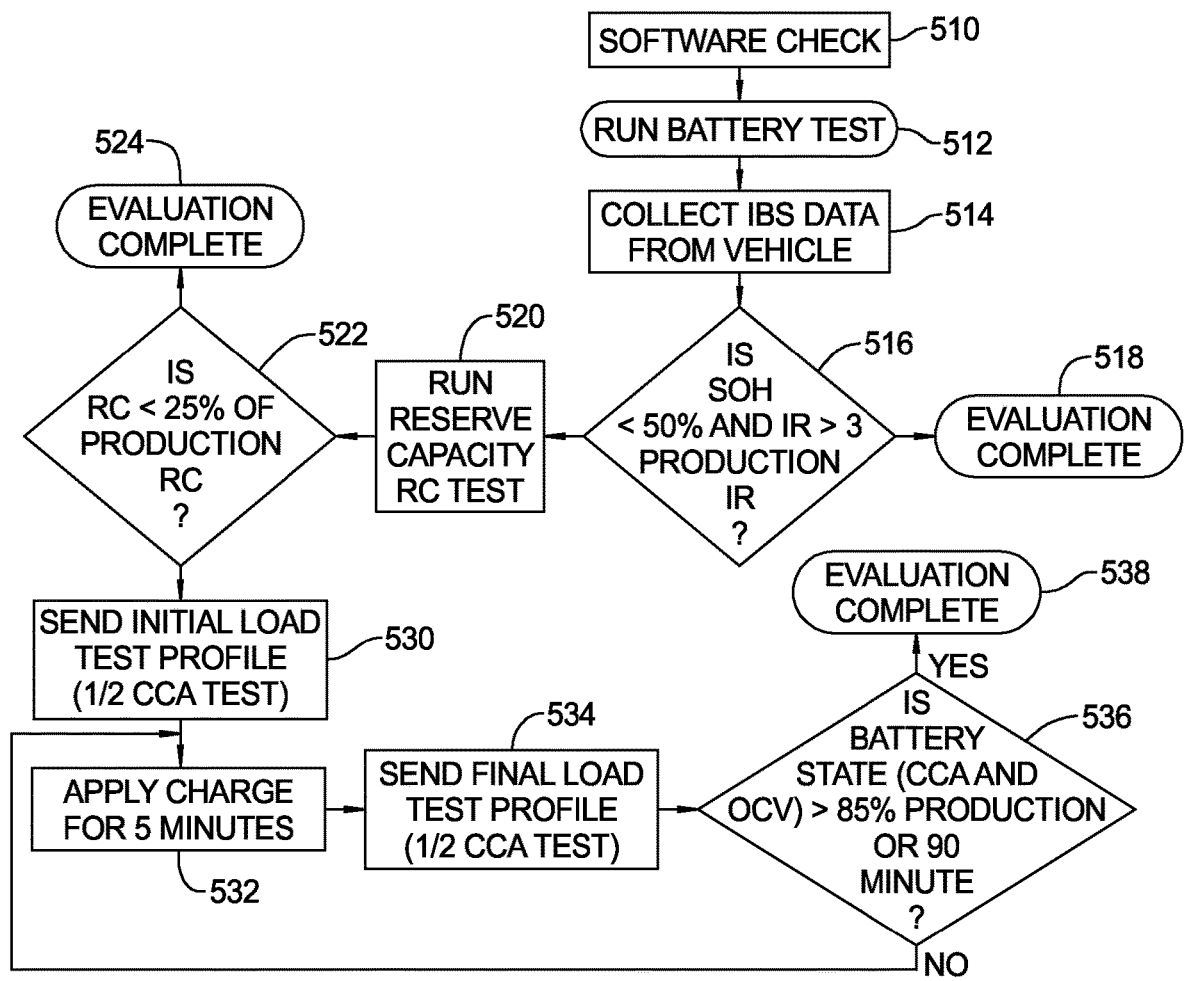
FIG. 5 is a flowchart of a method of operating a battery tester/charger.

Referring now to FIG. 5, a method for operating the battery tester/charger 10 is set forth. In this example, a software check is performed in step 510. The software updates are communicated from the software update system 36 illustrated in FIG. 1 when the software level of the battery tester/charger 10 is not up to date.

In step 512 a battery test is run. That is, a battery test is initiated at the battery tester/charger 10. The user interface 315 is used to initiate the operation of the battery test. In step 514, the battery sensor 412 communicates data from the vehicle to the battery tester/charger 10.

In step 516, the state of health (SOH) and the internal resistance (IR) are used to determine the need for replacement on high corrosion or internal manufactured bad cell type. The state of health is compared to a first threshold such as about fifty percent and the internal resistance is compared to a second threshold of, for example, three times the production internal resistance. When the state of health is less than the first thresholds, and the internal resistance is greater than three times the production internal resistance, the evaluation is completed in step 518. In this manner, the state of health and the internal resistance correspond to a high corrosion and bad test cell. The time to determine the high corrosion and bad cell test is less than five minutes. An indicator is provided on the display 54 for indicating the need for changing the battery. It should be noted that the process set forth in FIG. 5 is run simultaneously on one or more than one batteries. That is, the test set forth in FIG. 5 is run a primary and/or secondary or auxiliary battery.

In step 516 if the state of health is not less than a state of health (first) threshold and the internal resistance is not greater than three times the production internal resistance (second threshold) a reserve capacity test is performed in step 520. During the reserve capacity test, profiles are transmitted to the battery being tested in single or dual battery applications to determine the need for a replacement based upon severely discharged batteries. In step 522 if the reserve capacity is less than twenty-five percent of the production capacity (a third or reserve capacity threshold), the evaluation is complete in step 524. A display indicating a severely discharged battery is generated in step 524.

Referring back to step 522, if the reserve capacity is not less than twenty-five percent of the production reserve capacity step 530 is performed. In step 530, an initial load test profile of the battery is obtained. A suitable load test profile is the ½ cold cranking amp (CCA) test. In the ½ CCA test, a charge is applied for five minutes to the battery in step 532. As mentioned above, this is performed on a primary battery and also on an auxiliary battery should there be one in the system. In step 534, a final load test profile is generated based upon the ½ CCA test. In step 536 the battery state is determined based upon the final load test. The cold cranking amps and the open circuit voltage are determined. If the cold cranking amps is greater than eighty-five percent of the production CCA valve (CCA threshold (fourth threshold) and the open circuit voltage is greater than eighty-five percent of the production OCV (OCV threshold (fifth threshold) respectively), or the test in steps 532 and 534 have been performed for more than ninety minutes, step 538 ends the evaluation. A display indicating the batteries are discharged is generated in step 538.

Referring back to step 536, if the cold cranking amps and the open circuit voltage is not greater than eighty-five percent of their respective production values, or ninety minutes has not passed, steps 532 and 534 are again performed and another check at step 536 is performed.

When the vehicle has an auxiliary battery, the process set forth above is performed simultaneously with the primary battery. The battery sensor of the vehicle provides parameters such as the state of health and the internal resistance for both batteries.

Figure 6:
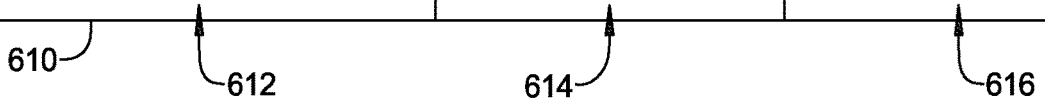
FIG. 6 is a screen display displaying various parameters as a result of tests performed.

Referring now to FIG. 6, a representative view of a display for displaying various parameters is set forth in a screen display 610. The screen display 610 includes a first column 612 that provides various parameters tested. Not all of the parameters need be provided in a screen display. In this example, high corrosion/bad cell, state of health, internal resistance, reserve charge ½ CCA test, load test and time out are provided for the primary battery in a first column 614 and a secondary battery in a third column 616. The primary battery and secondary battery provides pass or fail indicators associated with each of the parameters of the first column. A time out indicator is also provided if step 536 is run beyond a predetermined time. In addition, actual measured or calculated valves is also provided in this example.

As an alternative to FIG. 6, LED indicators are provided for each of the parameters in the first column 612. In such case, a red LED or green LED is used to indicate passing or failing of a particular test or a parameter outside of a threshold.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

The invention claimed is:

1. A battery tester for testing a primary battery of a vehicle comprising;
   a controller programed to perform the steps of
      obtain a state of health and an internal resistance of the primary battery from a vehicle controller;
      compare the state of health to a first threshold;
      compare the internal resistance to a second threshold; and
      perform a reserve charge test on the battery using the battery tester when the state of health is above a first threshold and the internal resistance is below a second threshold and generating a display indicative of high corrosion or a bad cell when the state of health is below the first threshold and the internal resistance is above the second threshold.

2. The battery tester as recited in claim 1 wherein the first threshold comprises 50 percent and the second threshold comprises three times a production internal resistance.

3. The method of testing the primary battery as recited in 1 wherein the internal resistance comprises a multiple of a production internal resistance.

4. The method of testing the primary battery as recited in claim 3 wherein the multiple comprises three.

5. The method of testing the primary battery of claim 4 wherein the first threshold is fifty percent and the internal resistance is three times the production internal resistance.

6. A method of testing a primary battery comprising:
   coupling a battery tester to terminals of the primary battery of a vehicle;

coupling the battery tester to a vehicle controller in the vehicle;

communicating a state of health of the primary battery and an internal resistance of the primary battery from the vehicle controller to the battery tester;

comparing the first battery parameter state of health to a first threshold;

comparing the internal resistance to a second threshold; and in response to the state of health being above a first threshold and the internal resistance below a second threshold, performing a reserve charge test to determine a reserve capacity of the battery using the battery tester; and when the state of health is below the first threshold and the internal resistance is above the second threshold generating a display indicative of high corrosion or a bad cell.

7. The method of testing the primary battery as recited in claim 6 wherein the first threshold comprises about 50 percent.

8. The method of testing the primary battery of claim 6 further comprising comparing the reserve capacity to a reserve capacity threshold and further comprising performing a battery load test in response to comparing or generating a display corresponding to a discharge battery.

9. The method of testing the primary battery of claim 8 further wherein generating a display corresponding a discharge battery when the reserve capacity is less than the reserve capacity threshold and performing the battery load test when the reserve capacity is above the reserve capacity threshold.

10. The method of testing the primary battery of claim 9 wherein preforming the battery load test for up to a maximum time or when a cold cranking amp is greater than a first value and open circuit voltage are greater than a second value.

11. The method of testing the primary battery of claim 10 wherein the first value is 85 percent of a production cold cranking amp value and the second value is greater than 85 percent of an open circuit value.

12. The method of testing the primary battery of claim 6 further comprising communicating test data to a system located remotely from the battery tester.

13. The method of testing the primary battery of claim 6 further comprising communicating a software update to the battery tester.

14. The method of testing the primary battery of claim 6 further comprising simultaneously performing the steps of communicating the state of health of the primary battery and an internal resistance of the primary battery from the vehicle controller to the battery tester, comparing the state of health to a first threshold, comparing the internal resistance to a second threshold, in response to comparing the state of health and the internal resistance, performing the reserve charge test on the battery using the battery tester or generating a display indicative of high corrosion or the bad cell, with testing an auxiliary battery of the vehicle.

15. The method of testing the primary battery of claim 14 wherein testing the auxiliary battery of the vehicle comprises communicating a third battery parameter of the auxiliary battery and a fourth battery parameter of the auxiliary battery from the vehicle controller to the battery tester;

comparing the third battery parameter to the first threshold;

comparing the fourth battery parameter to the second threshold; and in response to comparing the third battery parameter and the fourth battery parameter, performing the reserve charge test on the auxiliary battery using the battery tester or generating a second display indicative of high corrosion or a bad cell of the auxiliary battery.

\* \* \* \* \*